United States Patent [19]

Anjum et al.

[11] Patent Number: 5,372,951
[45] Date of Patent: Dec. 13, 1994

[54] METHOD OF MAKING A SEMICONDUCTOR HAVING SELECTIVELY ENHANCED FIELD OXIDE AREAS

[75] Inventors: Mohammed Anjum; Ibrahim K. Burki, both of Austin; Craig W. Christian, Buda, all of Tex.

[73] Assignee: Advanced Micro Devices, Inc., Sunnyvale, Calif.

[21] Appl. No.: 131,194

[22] Filed: Oct. 1, 1993

[51] Int. Cl.$^5$ .......................................... H01L 21/266
[52] U.S. Cl. .................................. 437/24; 437/70; 437/979
[58] Field of Search ............... 437/24, 69, 70, 950, 437/959, 979, 985; 148/DIG. 40, DIG. 116, DIG. 117, DIG. 163

[56] References Cited

U.S. PATENT DOCUMENTS

| 4,352,236 | 10/1982 | McCollum | 437/979 |
| 4,743,563 | 5/1988 | Pfiester et al. | 437/24 |
| 4,971,923 | 11/1990 | Nakanishi | 437/69 |

OTHER PUBLICATIONS

Wright et al, "The Effect of Fluorine in Silicon Dioxide Gate Dielectrics", *IEEE Trans. on Elec. Devices*, vol. 36, No. 5 May (1989), pp. 879–889.

Sung et al., "A Comprehensive Study on p+ Polysilicon-Gate MOSFET's Instability with Fluorine Incorporation", *IEEE Trans. on Elec. Devices*, vol. 37, No. 11, Nov. 1990, pp. 2312–2320.

Hsieh et al., "Characteristics of MOS Capacitors of $BF_2$ or Implanted Polysilicon Gate with and without $POCl_3$ Co-doped", *IEEE Electron Device Letters*, vol. 14, No. 5, May 1993, pp. 222–224.

*Primary Examiner*—Brian Hearn
*Assistant Examiner*—Chandra Chaudhari
*Attorney, Agent, or Firm*—Kevin L. Daffer

[57] ABSTRACT

A field oxide is provided which purposefully takes advantage of fluorine mobility from an implanted impurity species. The field oxide can be enhanced or thickened according to the size (area and thickness) of the oxide. Fluorine from the impurity species provides for dislodgement of oxygen at silicon-oxygen bond sites, leading to oxygen recombination at the field oxide/substrate interface. Thickening of the oxide through recombination occurs after it is initially grown and implanted. Accordingly, initial thermal oxidation can be shortened to enhance throughput. The fluorine-enhanced thickening effect can therefore compensate for the shorter thermal oxidation time. Moreover, the thickened oxide regions are anistropically oxidized underneath existing thermally grown oxides and directly underneath openings between nitrides. The thickened oxides therefore do not cause additional shrinkage of the active areas which reside between field oxides.

12 Claims, 2 Drawing Sheets

METHOD OF MAKING A SEMICONDUCTOR HAVING SELECTIVELY ENHANCED FIELD OXIDE AREAS

BACKGROUND OF THE INVENTION

1. Field of the Invention

This invention relates to semiconductor processing and more particularly to patterned field oxides which can be selectively thickened according to size and area of the oxides.

2. Background of the Relevant Art

A bare silicon surface will generally oxidize in air at room temperature, but because the growth is self-limiting, only a relatively small thickness can be achieved. The native oxide which is formed, provides a protective coating which prevents corrosion and prevents further oxidation in most room-temperature ambients. When the temperature is raised several hundred degrees C, the oxidation rate is much greater, and the oxide becomes denser and more durable. Accordingly, thermal oxidation of silicon has become a mainstay in the formation of oxides within active regions (gate oxides) and oxides within inactive regions (field oxides).

High temperature thermal oxides are formed by the direct oxidation of the silicon wafer surface at elevated temperatures in either a dry oxygen or a steam ambient. The resulting oxide is relatively impervious to diffusion species for at least as long as the time required for the diffusion to occur. Furthermore, the oxide is relatively free of pinholes. Most of the Group IIIA and VA dopants react with the thermally grown oxide to form silicates which gradually move through the oxide. Generally speaking, silicates do not form completely through and do not touch the underlying silicon and, therefore, do not become a diffusion source for the active or inactive regions. Thus, the thickness of the oxide must be carefully tailored to the required diffusion time and temperature.

While other materials such as chemical vapor deposition (CVD) oxide or nitride can be used as a mask against diffusion species, no commercially proven substitute for a thermal oxide currently exists to provide silicon pn junction passivation or MOS gate oxides. The prime importance of thermal oxide stems from its ability to properly terminate the silicon bond at the silicon-oxide interface. The deleterious electrical effects of a bare silicon surface, or of one covered only with room-temperature native oxides are thereby minimized with thermally grown oxides.

In order to form active and inactive regions, a process known as local oxidation of silicon (LOCOS) has been used to provide dielectric isolation. LOCOS utilizes a silicon nitride material (i.e., $Si_3N_4$) to mask active regions from the growth of field oxide. Being somewhat impervious to oxygen diffusion, the silicon nitride layer is placed upon bare silicon, or upon a pad oxide overlying bare silicon, at select regions upon the wafer. A subsequent oxidation step will thermally grow oxide predominantly where the nitride is not present. The oxidation rate upon the upper surface of the nitride is much slower than the rate upon the bare silicon between the nitrides. As such, the nitrides and small thin layer of oxide at the upper surface of the nitride is easily removed leaving thick field oxides in the non-masked areas.

Because of the high stress at the nitride-silicon interface, dislocations will often be generated in the silicon at the edges of the oxide (i.e., at the edges of the non-nitride windows). Interface dislocations and/or stress often exasperates the problem of lateral diffusion of oxygen within the silicon. Lateral diffusion of oxygen or lateral consumption of silicon by growing oxide at the nitride interface gives rise to "birdbeak" structures. Generally speaking, the density value reported for thermal oxide is close to that of fused silica and is almost the same as that of silicon. These densities, coupled with respective molecular weights of 60 and 28 (molecular weight of oxide and silicon, respectively), dictate that for every volume of silicon oxidized, 2.2 volumes of oxide will be generated. Silicon will therefore be consumed and the top of the oxide will rise above and extend outward from the original silicon surface.

As the density of integrated circuits increase and circuit dimensions decrease, the problems of lateral growth of field oxides are compounded. Furthermore, high density processes bring about another problem generally referred to as "field oxide thinning." Field oxide thinning and birdbeak formation is best described by referencing FIGS. 1 and 2. In FIG. 1, a cross-sectional view of a semiconductor substrate 10 is shown. Substrate 10 includes an upper surface adapted to receive a masking layer, such as silicon nitride, necessary for LOCOS processing. Silicon nitride is generally blanket deposited across the entire substrate and then etched to present a patterned silicon nitride 12. Windows, which are etched within the nitride layer to form pattern 12, can be either small or large area windows, A1 or A2, respectively.

Thermal oxides can be grown in either atmospheric or high pressure chambers. Atmospheric equipment cannot achieve the higher oxidation rate of high pressure equipment, however, atmospheric units are less expensive to operate and maintain. In either case, oxidation equipment forwards an oxidizing agent such as dry oxygen or steam across the upper surface of substrate 10. It is well recognized that growth resulting from the oxygen or steam will vary depending upon the size of the silicon surface presented to the ambient. The growth rate in confined spaces or areas, such as area A1, is less than growth in larger areas, such as area A2. Furthermore, the oxide grown in a confined area usually has an increased stress within the resulting product. Accordingly, FIG. 2 illustrates varying growth rates in directions lateral and perpendicular to substrate 10 upper surface. For a given oxidation time, thickness t1 is shown less than thickness t2. Birdbeak areas 18 occur to further lessen active areas between field oxide 20 and 22.

Growth of field oxides 20 and 22 depend upon many factors, including: oxidation time, oxidizing ambient, ambient pressure and/or temperature, impurity in the silicon, the amount of stress in the oxide and silicon, and area of silicon exposed to the ambient. Oxide thinning is the result of oxides growing at a slower rate in small areas than in larger areas. The result of small oxide growth, or oxide thinning, is that of a smaller dielectric thickness t1 in some field areas than in others—i.e., thickness t2 of large oxide 22. A thinner dielectric, when coupled with an overlying conductor, presents parasitic capacitance. If the dielectric is small enough, field inversion beneath of thinner dielectric will occur. High density integrated circuits further compound the field thinning effect and can lead to "turn-on" channels in areas where a channel should not exist. Such problems can lead to inoperability of the resulting circuit.

SUMMARY OF THE INVENTION

The problems outlined above are in large part solved by the improved field oxide structure and method of manufacture accorded to the present invention. That is, field oxide regions which are small in area can be enhanced to offset the field oxide thinning effect. Oxides are thickened after they are thermally grown by doping the oxides with an impurity species which includes fluorine, and allowing the implanted fluorine to dislodge oxygen from the oxide bulk. The dislodged oxygen recombine with silicon at the juncture between the oxide and the substrate to form silicon dioxide bonds therein.

The thickened field oxide occurs predominantly in small oxide areas. A larger amount of fluorine will migrate into and through thin oxides than counterpart thick oxides. As a result, a larger portion of fluorine atoms exist at or near the interface of a small oxide area necessary for dislodgment and subsequent recombination at the interface. Thin oxides therefore present a naturally receptive area for the enhanced or thickened effect caused by recombination. An important advantage thereof being a substantial equilibrium or uniformity in thickness of the final. oxides formed across the wafer as a result of recombination, regardless of the initial, thermal oxidation-formed size. The thin oxides will oxidize further into the substrate as a result of fluorine mobility in order to bring their thickness up to and substantially equal to thicker oxides of larger area. Blanket implanted impurity species comprising fluorine will therefore provide a natural evenness to oxides of varying size which have been initially grown to an uneven thickness. As defined herein, "impurity species" includes any ionic chemical compound or element having fluorine as an element within the compound or as the sole element. Exemplary impurity species include: $BF_2+$, $BF+$, or $F+$. A $BF_3$ gaseous source material may be used to produce the source to an ion implanter equipped with an analyzer magnet for passing only the select ionic output (e.g., $BF_2+$, $BF+$, or $F+$).

Broadly speaking, the present invention contemplates a method for thickening a small oxide greater than a large oxide. The method comprises the steps of providing a substrate and a nitride layer patterned across the substrate. A small oxide of relatively small area and thickness as well as a large oxide of relatively large area and thickness is grown upon the substrate and between the patterns of the nitride layer. Next, an impurity species, which includes fluorine, is implanted within the small oxide and large oxide. A greater amount of fluorine from the species will diffuse through the small oxide than through the large oxide, resulting in greater thickening of the small oxide than the large oxide.

Without being bound to theory, the mechanism by which fluorine causes a thickening of the small oxide begins by understanding the high mobility of fluorine, and the ability of fluorine to quickly diffuse to a plurality of silicon-oxygen bond sites located within a bulk portion of the oxide, near the silicon/oxide interface. The fluorine ions can dislodge oxygen atoms at the plurality of bond sites, wherein the dislodged oxygen atoms recombine with silicon atoms at the interface or juncture between the small oxide and substrate. Converse to small oxide dislodgment and recombination processes, large oxide, due to its initial thickness (i.e., thermally grown thickness), substantially prevents the dislodgment and recombination steps of a substantial majority of the fluorine atoms. In other words, dislodgment of oxygen and the recombination of the oxygen at the interface occurs less frequently and in smaller amounts in large oxides than in small oxides.

The present invention further contemplates a method for increasing the thickness of a small oxide to substantially match the thickness of a large oxide. The method comprises the steps of providing a silicon substrate having a substantially planar upper surface, and placing a layer of nitride upon the upper surface. The nitride is patterned with a plurality of windows extending through the nitride to the upper surface. At least one of the windows comprises a small area extending parallel to the upper surface and another of the windows comprises a large area also extending parallel to the upper surface. The small area is relatively smaller than the large area. A small oxide of small thickness is grown within the small window simultaneous with a large oxide grown within a large window. Both the small and large oxides grow perpendicular and parallel to the upper surface. After the small and large oxides are grown, an impurity species is implanted within the small oxide and large oxide. Fluorine from the species will diffuse to a deeper depth or through the lesser thickness of the small oxide to a greater extent than into or through the greater thickness of the large oxide. The substrate is then oxidized with the aid of the fluorine in a direction substantially perpendicular to the upper surface directly beneath the small window and the large window. The substrate underlying the small oxide is oxidized at a faster rate than the substrate underlying the large oxide. The oxidizing step is allowed to continue for a sufficient time to permit the thickness of the small oxide to substantially match the thickness of the large oxide.

The enhanced thickness of the small oxide lies directly underneath the small window, and therefore, does not extend laterally into adjacent active areas—a deleterious effect often attributed to birdbeak formation. By overcoming normal lateral birdbeak formation, the present oxidizing step for providing additional oxide, or enhancing oxide thickness, is well suited for high density circuit applications. Moreover, the resulting enhanced or thickened small oxide is less susceptible to field inversion or turn-on caused by high voltages or currents within overlying conductors. Still further, the impurity species advantageously includes $BF_2$, which can provide fluorine (recombination enhancement feature) as well as boron (channel stop dopant feature). Boron is a dopant which is placed into the substrate underlying the oxides. More boron dopant will diffuse through the small oxide than through the large oxide. Accordingly, boron dopant as well as thickened oxide prevents inversion of the channel region. Introduction of boron increases minority carriers in p− substrate tubs and does not significantly decrease heavily doped n− tubs. Thus, boron effectively increases the threshold voltages in any CMOS-processed channel. $BF_2$ ions thereby provide a dual function which is an important aspect of the present invention.

The present invention still further contemplates an enhanced field oxide area. The area comprises a silicon substrate having a planar upper surface and an oxide having silicon-oxygen atomic bonds grown upon the upper surface. Fluorine atoms can be anistropically placed within the oxide, wherein a substantial amount of fluorine atoms migrate and dislodge oxygen from the silicon-oxygen bonds. Additional oxygen at the juncture between the oxide and the upper surface resulting from the dislodged oxygen can recombine with silicon atoms within the substrate. Due to the anistropic nature of fluorine implant, oxygen recombination sites exist only within an area directly beneath the windows and between the patterns of nitride.

BRIEF DESCRIPTION OF THE DRAWINGS

Other objects and advantages of the invention will become apparent upon reading the following detailed description and upon reference to the accompanying drawings in which.

Figure 1:
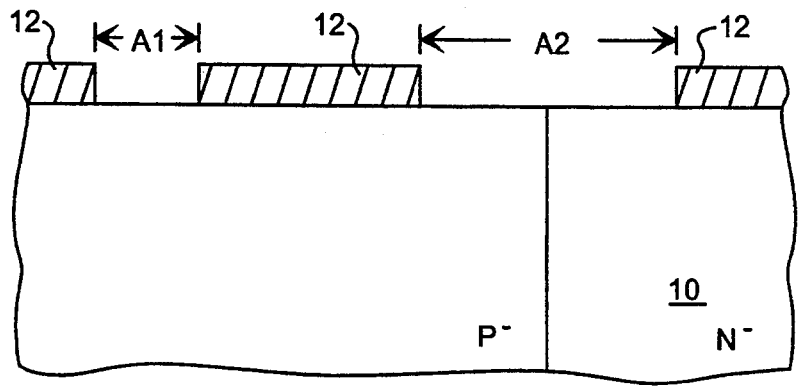
FIG. 1 is a cross-sectional view of a semiconductor substrate and a patterned nitride layer placed upon the upper surface of the substrate according to one step of a prior art manufacturing process.
Figure 2:
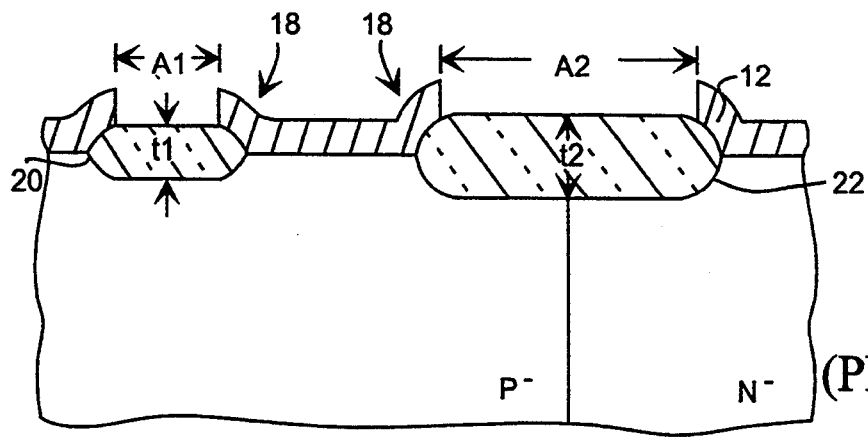
FIG. 2 is a cross-sectional view of small and large area field oxides grown upon the substrate and between the patterned nitride according to another step of a prior art manufacturing process.

While the invention is susceptible to various modifications and alternative forms, specific embodiments are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present. invention as defined by the appended claims.

DETAILED DESCRIPTION OF THE INVENTION

Figure 3A:
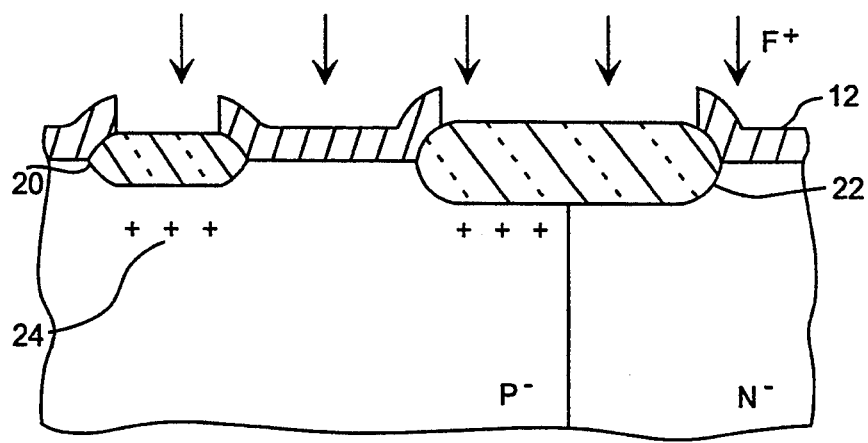
FIG. 3a is a cross-sectional view of small and large area field oxides implanted with fluorine ions during a processing step according to an exemplary embodiment of the present invention.

Turning now to FIG. 3a, a cross-sectional view of small oxide 20 and large oxide 22 is shown. Oxides 20 and 22 are thermally grown upon substrate 10 and between patterned nitride 12. The upper topography of the structure shown in FIG. 3a can, according to one embodiment, be implanted with fluorine ions using conventional implantation techniques. Although not shown, but well understood, the fluorine ions are implanted after a channel stop implantation step. Channel stop implant generally involves masking, for example, the P— well with photoresist and doping the field oxides 20 and 22 with boron. The boron dopant is introduced after nitride deposition to prevent boron from entering the active regions. Accordingly, FIG. 3a illustrates boron atoms placed in the inactive regions as indicated by reference numeral 24. The boron atoms help minimize occurance of field oxide inversion.

Preferably, fluorine and/or boron ions are anistropically implanted with either a low or medium current ion implanter. The implanter ionizes an appropriate molecular species and filters the ionized species according to atomic mass number. A resulting ion beam is then focused upon the upper topography surface of the substrate. The fluorine ions are accelerated into the substrate at a dose within the range of $1\times10^{13}$ atoms/cm$^2$ to $5\times10^{14}$ atoms/cm$^2$ at an implant energy greater than 100 keV, for a 3000 Å field oxide. The depth of implant is within the range of 2010 Å, with a lateral straggle (or std. deviation) of approximately 640 Å. Likewise, boron ions can be accelerated upon the substrate at a dose within the range of $1\times10^{13}$ atoms/cm$^2$ to $6\times10^{13}$ atoms/cm$^2$ at an implant energy of approximately 26 keV. The depth of implant is approximately within the range of 943 Å.

Implantation of fluorine ions has been carefully studied in recent years. It has been determined that fluorine ions, when implanted into a polysilicon material, can cause thickening of the underlying gate oxide See, e.g., Wright, et al., "The Effect of Fluorine in Silicon Dioxide Gate Dielectrics," *IEEE Trans. on Electron Devices*, vol. 36, no. 5, May, 1989; and, Sung, et al., "A Comprehensive Study on p+ Polysilicon-Gate MOSFET's Instability With Fluorine Incorporation," *IEEE Trans. on Electron Devices*, vol. 37, no. 11, Nov., 1990 (incorporated herein by reference). Fluorine atoms readily migrate to weakened bonds within the polysilicon and forces oxygen to recombine with silicon at the gate oxide/silicon interface. A thickened gate oxide will thereby increase turn-on voltages as well as gate oxide capacitance. In order to alleviate the problem, recent work has focused upon co-doping $POCl_3$ within the polysilicon to block fluorine mobility and thereby lessen or minimize the recombination effect. Work has thereby focused upon trying to minimize or prevent fluorine mobility instead of encouraging mobility. See, Hsieh, et al., "Characteristics of MOS Capacitors of $BF_2$ or B Implanted Polysilicon Gate With and Without $POCl_3$ Co-doped," *IEEE Electron Device Letters*, vol. 14, no. 5, May, 1993.

Figure 3B:
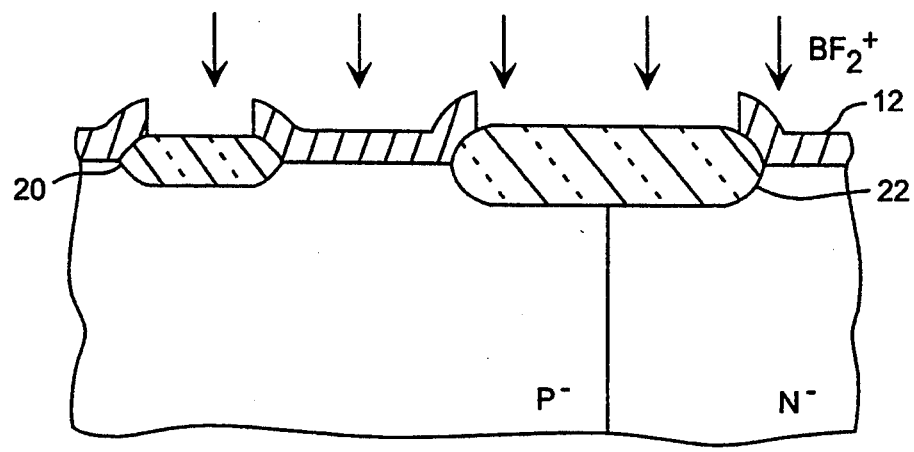
FIG. 3b is a cross-sectional view of small and large area field oxides implanted with $BF_2$ ions during a processing step according to another exemplary embodiment of the present invention.

As shown in FIG. 3a, fluorine ions are placed within small and large field oxides 20 and 22, respectively, to purposefully increase or enhance the recombination effect. In addition to fluorine, boron can also be used to provide a channel stop feature (i.e., to prevent field oxide inversion). Turning now to FIG. 3b, a cross-sectional view of small and large oxides 20 and 22, respectively, are shown implanted with relatively high energy $BF_2$ ions according to an alternate embodiment. $BF_2$ implant is used to encourage fluorine mobility within the oxides as well as provide boron dopant underneath the oxides. Thus, $BF_2$ can be used to provide a dual purpose. Instead of having to undergo a prior lithography (masking) step with boron implant, boron from $BF_2$ can be implanted simultaneous with fluorine. However, it is understood that the starting concentration density of the N— well may require pre-adjustment in order to compensate for additional boron (n— type impurities) at the N— well/field oxide interface. Fluorine, from the $BF_2$, readily migrates deep within the oxides, or through the oxides, and is purposefully used to dislodge oxygen from silicon-oxygen bonds. Furthermore, the dislodged oxygen, generally found near the interface region or near the underlying silicon, has a lesser distance to travel to the interface region where it recombines with silicon therein. Thus, highly mobile fluorine is more predominant in small oxide 20 having a thinner dimension t1 than larger oxide 22 having a thicker dimension t2.

Figure 4:
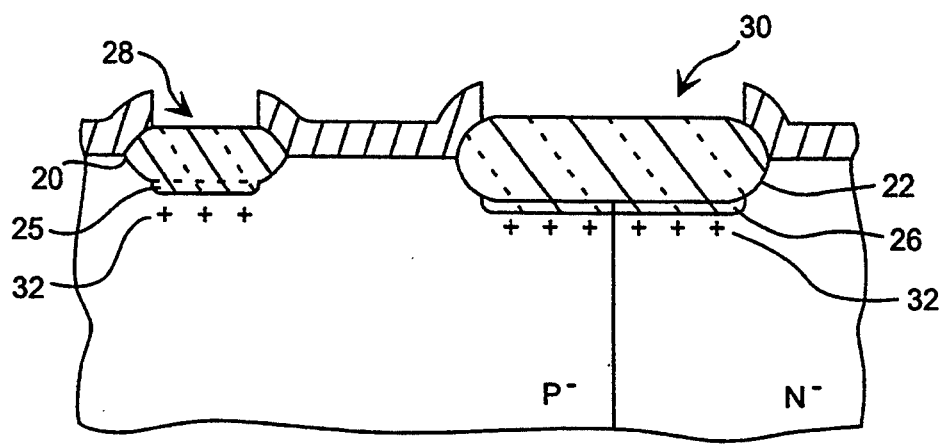
FIG. 4 is a cross-sectional view of small and large area field oxides which are enhanced or thickened according to another processing step of the present invention.

Blanket F+ or $BF_2+$ implant is anistropically placed within the oxide such that the silicon-oxygen bonds, which are broken by the mobile fluorine, are directly beneath the windows which separate patterned nitride 12. As shown in FIG. 4, anisotropic implantation and resulting oxygen recombination occurs in regions 25 and 26, adjacent small and large oxides 20 and 22, respectively. Region 25 is only formed directly below window 28, while region 26 is only formed directly below window 30. Very little if any lateral diffusion occurs during the formation of additional oxides in region 25 and 26. Advantageously, additional oxide within regions 25 and 26 do not add to birdbeak problems and shrinkage of active regions between oxides.

Additional oxide within region 25 has a greater thickness than additional oxide within region 26, the reason being that more fluorine atoms permeate substantially through or completely through oxide 20 than oxide 22. More oxygen will thereby recombine within region 25 than region 26. Fluorine mobility, oxygen dislodgment, and oxygen recombination hereof is therefore well suited to enhance the growth rate of additional oxides such that, over time, the final smaller oxide thickness will substantially match the final larger oxide thickness.

Still further, boron dopants from $BF_2$ ions are implanted through oxides 20 and 22, provided suitable implant energy and concentration is present. Boron dopants (either originated separate from and prior to fluorine dopants, as in FIG. 3a, or simultaneous with fluorine dopants, as in FIG. 3b) are placed into the substrate and accumulate into channel region underneath the field oxides, as shown by reference numeral 32. For simplicity, dopants 34 are shown extending across the entirety of field oxide 22 and into the N− well, even though it is well recognized that they would not extend the entire distance if the N− well is masked. Additional boron concentration 32 can help reduce field inversion problems normally associated with thinner field oxides. Thus, if $BF_2$ ions are used, the $BF_2$ ions provide a dual purpose: (i) to provide an additional oxide growth rate inversely proportional to the size of the initial, thermally grown oxide, and (ii) to dope the substrate underlying the oxides to a concentration level inversely proportional to the size or thickness of the oxide.

Figure 5:
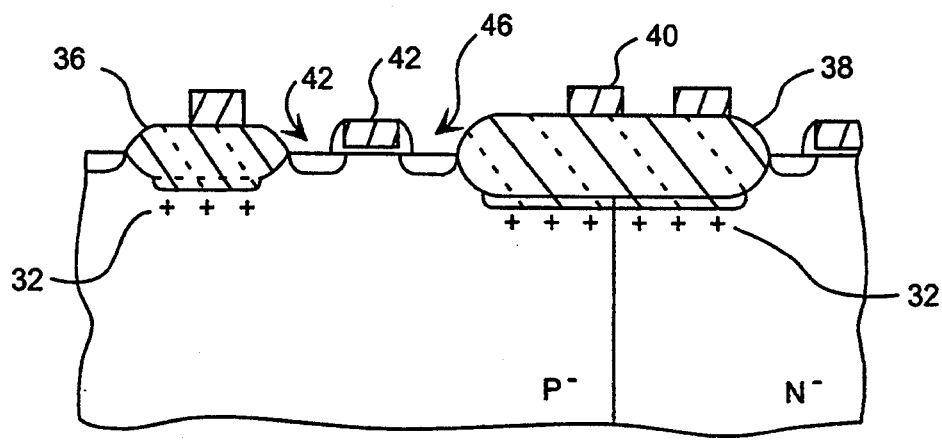
FIG. 5 is a cross-sectional view of enhanced small and large field oxides with overlying metallization conductors formed according to yet another processing step of the present invention.

Referring now to FIG. 5, a cross-sectional view of active and inactive regions of a portion of a semiconductor surface are shown. In particular, an enhanced small field oxide 36 (a combination of initial oxide 20 and additional oxide 25) as well as an enhanced large field oxide 38 (a combination of initial oxide 22 and additional oxide 26) is shown. The enhanced small and large oxides 36 and 38, respectively, include an upper surface for receiving patterned metallization 40. Metallization 40 includes a conductive strip which can electrically connect various circuits formed across the semiconductor die. Metallization 40 (either polysilicon, aluminum, etc.) can also be placed upon gate electrodes residing over gate oxides 42 within active regions 46. Gate oxides 42 are much thinner than enhanced field oxides 36 and 38. Preferably, gate oxides 42 are less than a hundred Ångstroms in thickness, while field oxides are oftentimes a few thousand Ångstroms in thickness.

By using fluorine to enhance oxygen recombination at select interface sites, the additional oxides 25 and 26 can be used to offset the thermal oxidation time. In other words, thermal oxidation and time related thereto can be reduced or shortened. A shorter thermal oxidation time can increase wafer throughput. Additional oxides 25 and 25 are therefore used to compensate for thinner, thermally grown oxides.

It will be appreciated to those skilled in the art having the benefit of this disclosure that this invention is believed to be capable of PMOS or CMOS applications using either (i) masked boron implant followed by blanket fluorine implant, or (ii) blanket $BF_2$ implant. In either case, the resulting device is capable of shallow channel and shallow source/drain operation. It is also to be understood that the form of the invention shown and described is to be taken as presently preferred embodiments. Various modifications and changes may be made without departing from the spirit and scope of invention as set forth in the claims. Provided the impurity species (fluorine or $BF_2$ ions) are placed in a substantially anisotropic fashion, an exemplary modifications might be one which uses various types of implant or diffusion equipment for introducing fluorine into the oxide. Fluorine ions implanted within the range (depth) and at the energy level specified hereinabove are merely exemplary dosages and energies for an ion implanter. Numerous other ranges and levels can be achieved provided fluorine is implanted to a sufficient depth within the small and large oxides to allow mobility and subsequent oxidation effect at the small oxide/substrate interface, while substantially minimizing the same effect at the large oxide/substrate interface. It is intended that the following claims be interpreted to embrace all such modifications and changes.

What is claimed is:

1. A method for thickening a first oxide greater than a second oxide, said method comprising the steps of:

providing a substrate;

thermally growing a first oxide of a first area and thickness simultaneous with thermally growing a second oxide of a second area and thickness upon said substrate, wherein said second area and thickness is greater than said first area and thickness; and implanting an impurity species within said first oxide and said second oxide, wherein said impurity species comprises a chemical selected from the group consisting of $BF_2$, BF and F, and wherein fluorine from said species will diffuse through said first oxide to a greater extent than through said second oxide resulting in greater thickening of said first oxide than said second oxide.

2. The method as recited in claim 1, wherein said implanting step comprises:

allowing a portion of said fluorine atoms to diffuse to a plurality of silicon-oxygen bond sites located within a bulk portion of said first oxide near a juncture between said first oxide and said substrate;

allowing said fluorine atoms to dislodge oxygen atoms at said plurality of silicon-oxygen bond sites; and allowing said dislodged oxygen atoms to recombine with silicon atoms at said juncture.

3. The method as recited in claim 1, wherein said implanting step comprises:

preventing a majority of said fluorine atoms from diffusing to a plurality of silicon-oxygen bond sites located within a bulk portion of said second oxide near a juncture between said second oxide and said substrate;

preventing said fluorine atoms from dislodging oxygen atoms at said plurality of silicon-oxygen bond sites; and preventing said dislodged atoms from recombining with silicon atoms at said juncture.

4. The method as recited in claim 1, wherein said implanting step comprises allowing a portion of boron atoms from said impurity species to reside at a point below said first oxide and said second oxide and within said substrate underlying respective said first and second oxides.

5. The method as recited in claim 5, wherein said boron atoms comprise a dopant source material that, when implanted into said substrate, increases threshold voltages within said substrate underlying said first and second oxides.

6. The method as recited in claim 1, wherein said implanting step comprises the steps of:

providing a window through a patterned nitride layer;

dislodging oxygen atoms with said fluorine in an area within said first oxide directly beneath said window; and recombining said oxygen atoms at a juncture between said first oxide and said substrate directly beneath said window.

7. The method as recited in claim 1, further comprising implanting conductors over said small oxide and said large oxide.

8. A method for increasing the thickness of a first oxide to substantially match the thickness of a second oxide, said method comprising the steps of:

providing a silicon substrate having a substantially planar upper surface;

placing a layer of nitride upon said upper surface;

patterning a plurality of first and second windows extending through said nitride and to said upper surface, wherein at least one of said first windows comprises a first area extending parallel to said upper surface and at least one of said second windows comprises a second area extending parallel to said upper surface, said first area is smaller than said second area;

growing a first oxide of first thickness within said first window in a direction perpendicular and parallel to said upper surface;

simultaneously growing a second oxide of second thickness within said second window in a direction perpendicular and parallel to said upper surface;

implanting an impurity species within said first oxide and said second oxide, wherein said impurity species comprises a chemical selected from the group consisting of $BF_2$, BF and F; and wherein fluorine atoms from said species will move through said first oxide to a lesser extent than through said second oxide;

oxidizing said substrate with the aid of said fluorine atoms in a direction perpendicular to said upper surface directly beneath said first window and said second window, wherein said substrate underlying said first oxide is oxidized to a greater degree than said substrate underlying said second oxide; and allowing said oxidizing step to continue for a sufficient time to permit the thickness of said first oxide to match the thickness of said second oxide.

9. The method as recited in claim 8, wherein said implanting step comprises allowing a portion of boron atoms from said impurity species to reside at a point below said first oxide and said second oxide and within said substrate underlying respective said first and second oxides.

10. The method as recited in claim 9, wherein said boron atoms comprise a dopant source material that, when implanted into said substrate, increases threshold voltages within said substrate underlying said first oxide to a greater extent than said substrate underlying said second oxides.

11. The method as recited in claim 8, wherein said oxidizing step comprises:

breaking silicon-oxygen bonds within said first oxide and adjacent said substrate with said fluorine in a region directly beneath said first window;

breaking silicon-oxygen bonds to a lesser extent than said immediately preceding step within said second oxide and adjacent said substrate with said fluorine in a region directly beneath said second window;

recombining oxygen atoms at a juncture between said first oxide and said substrate directly beneath said first window; and recombining oxygen atoms to a lesser extent than said immediately preceding step at a juncture between said second oxide and said substrate directly beneath said first window.

12. The method as recited in claim 8, further comprising implanting conductors over said first oxide and said second oxide.

* * * * *

UNITED STATES PATENT AND TRADEMARK OFFICE
CERTIFICATE OF CORRECTION

PATENT NO.   : 5,372,951
DATED        : December 13, 1994
INVENTOR(S)  : Anjum, et al It is certified that error appears in the above-indentified patent and that said Letters Patent is hereby corrected as shown below:

Claim 5, col. 9, line 12, please delete "claim 5" and substitute therefor --claim 4--.

Signed and Sealed this

Fourth Day of April, 1995

Attest:

BRUCE LEHMAN

Attesting Officer          Commissioner of Patents and Trademarks